(12) United States Patent
Lin et al.

(10) Patent No.: US 7,135,402 B2
(45) Date of Patent: Nov. 14, 2006

(54) SEALING PORES OF LOW-K DIELECTRICS USING $C_XH_Y$

(75) Inventors: Keng-Chu Lin, Ping-Tung (TW); Shwang-Ming Cheng, Hsin-Chu (TW); Ming Ling Yeh, Tainan (TW); Tien-I Bao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/048,518

(22) Filed: Feb. 1, 2005

(65) Prior Publication Data

US 2006/0172531 A1    Aug. 3, 2006

(51) Int. Cl.
*H01L 21/4763* (2006.01)

(52) U.S. Cl. ............... 438/639; 438/624; 257/E21.584; 257/E21.576

(58) Field of Classification Search ................ 438/637, 438/623, 624, 639; 257/E21.584, E21.576
See application file for complete search history.

(56) References Cited

U.S. PATENT DOCUMENTS

| | | | |
|---|---|---|---|
| 6,159,786 A | 12/2000 | Chiang et al. | |
| 6,248,665 B1 | 6/2001 | Bao et al. | |
| 6,271,123 B1 | 8/2001 | Jang et al. | |
| 6,383,935 B1 | 5/2002 | Lin et al. | |
| 6,424,044 B1 | 7/2002 | Han et al. | |
| 6,514,855 B1* | 2/2003 | Suzuki et al. | 438/637 |
| 6,541,842 B1* | 4/2003 | Meynen et al. | 257/632 |
| 6,607,977 B1 | 8/2003 | Rozbicki et al. | |
| 6,616,855 B1 | 9/2003 | Chen et al. | |
| 6,624,066 B1 | 9/2003 | Lu et al. | |
| 6,723,635 B1 | 4/2004 | Ngo et al. | |
| 6,878,615 B1 | 4/2005 | Tsai et al. | |
| 6,905,958 B1* | 6/2005 | Gracias et al. | 438/643 |
| 2004/0018452 A1 | 1/2004 | Schilling | |
| 2004/0099952 A1 | 5/2004 | Goodner et al. | |
| 2004/0121583 A1 | 6/2004 | Bao et al. | |
| 2004/0121586 A1* | 6/2004 | Abell | 438/637 |
| 2004/0156987 A1 | 8/2004 | Yim et al. | |
| 2005/0148202 A1* | 7/2005 | Heiliger et al. | 438/778 |
| 2005/0245071 A1 | 11/2005 | Wu et al. | |
| 2006/0027929 A1 | 2/2006 | Cooney, III, et al. | |
| 2006/0027930 A1 | 2/2006 | Edelstein et al. | |

* cited by examiner

Primary Examiner—Caridad M. Everhart
(74) Attorney, Agent, or Firm—Slater & Matsil, L.L.P.

(57) ABSTRACT

A semiconductor method of manufacturing involving porous and/or carbon containing, low-k dielectrics is provided. The method includes forming a hydrocarbon of the general composition $C_xH_y$ on the surface of the low-k dielectric. The hydrocarbon layer includes depositing a precursor material, preferably $C_2H_4$ or $(CH_3)_2CHC_6H_6CH_3$. In accordance with embodiments of this invention, carbon diffuses into the low-k dielectric, thereby reducing carbon depletion damage caused by plasma processing or etching. Surface dielectric pores damaged by plasma processing are also repaired by sealing them with the $C_xH_y$ layer. Embodiments include semiconductor devices, such as devices having damascene interconnect structures, manufacturing using methods provided.

16 Claims, 4 Drawing Sheets

SEALING PORES OF LOW-K DIELECTRICS USING $C_xH_y$

CROSS-REFERENCE TO RELATED APPLICATIONS

This application relates to co-pending and commonly assigned patent application Ser. No. 11/048,215 (TSM04-0867), filed concurrently herewith, entitled "$C_xH_y$ Sacrificial Layer for Cu/Low-K Interconnects." This application also relates to co-pending and commonly assigned patent application Ser. No. 10/985,149 (TSM04-0369), filed Nov. 10, 2004, entitled "Diffusion Barrier for Damascene Structures." These co-pending and commonly assigned patent applications are hereby incorporated by reference.

TECHNICAL FIELD

This invention relates generally to semiconductor device manufacturing and more particularly to the formation and processing of porous, low-k dielectrics.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

The conductive material is typically patterned and etched using high-energy plasma etch processes. The low-k materials are susceptible to damage from a plasma etch because they are softer, less chemically stable or more porous, or any combination of these factors. The plasma damage can manifest itself in higher leakage currents, lower breakdown voltages, and changes in the dielectric constant associated with the low-k dielectric material.

One example of a low-k material is a carbon-doped oxide or organosilicate glass (OSG). OSG films typically comprise $Si_wC_xO_yH_z$, wherein the tetravalent silicon may have a variety of organic group substitutions. A commonly used substitution creates methyl silsesquioxane (MSQ), wherein a methyl group creates a $SiCH_3$ bond in place of a SiO bond. Upon exposure to a processing plasma, as in photoresist removal, plasma damage may cause the methyl group to be replaced with a OH group, thereby forming a silanol.

Silanol bonds at the surface of the OSG material have been observed to degrade the integrity of a low-k dielectric film. One form of degradation is the increase in the dielectric constant of the low-k dielectric material due to the presence of the silanol. In addition, the damaged OSG material has been observed to adsorb moisture. It has also been observed that this degraded low-k dielectric material is vulnerable to chemical attack during exposure to wet chemical cleanups, which results in significant critical dimension (CD) loss of low-k dielectric film insulating structures.

Another example of low-k dielectric materials are the porous dielectrics such as the commercially available Dow Chemical's porous SILK product and JSR Corporation's JSR 5109. The dielectric constant of the porous material is a combination of the dielectric constant of air and the dielectric constant of the dense material. Silica based xerogels and aerogels, for example, incorporate a large amount of air in pores or voids, thereby achieving dielectric constants less than 1.95 with pores as small as 5–10 nm.

Just as with carbon containing dielectrics, porous dielectrics are also susceptible to damage from plasma etching and ashing processes used in device fabrication. When there is an open pore in the dielectric, processing fluids in lap and polish and in thin film metallization can enter surface pores, thereby causing corrosion, mechanical damage, or an increase in the dielectric constant. Pore damage may also cause a surface that is preferably hydrophobic to become hydrophilic.

FIG. 1 shows a schematic representation of a cross-section of a damascene structure. Dielectric 12 has been laid down over wiring level 11. Extending downwards from trench 15 is a via 14. When the structure has been filled with copper, via 14 provides a connection between the two wiring levels. Because of its high diffusivity and its tendency to act as a recombination center in silicon, steps must be taken to ensure that all the copper is confined to the damascene structure. This is conventionally accomplished with a barrier layer 18 in that lines the walls of the trench 15 and via 14, as illustrated in FIG. 2.

As described above, chemicals may penetrate into the low-k dielectric pores and raise its dielectric constant. Low-k dielectric damage also causes surface roughness of the trench floor 21 and trench wall 23, as shown in FIGS. 1 and 2. The rougher surface means that a much thicker barrier layer 18, FIG. 2, than normal is needed to ensure that there are no thin patches through which copper could move. The thicker barrier layer 18, in turn, partially offsets the advantage of the low-k dielectric by increasing the resistance capacitance (RC) delay time.

As noted above, dielectric damage causes higher leakage currents, lower breakdown voltages, and changes in the dielectric constant associated with the low-k dielectric material. In view of these and other problems, there is a need for improved low-k dielectric manufacturing methods.

SUMMARY OF THE INVENTION

These and other problems are generally solved or circumvented and technical advantages are generally achieved by preferred embodiments of the present invention that provides a method for repairing low-k dielectrics suffering from pore damage or carbon depletion.

A preferred embodiment provides a method for forming a semiconductor device. The method comprises, forming a low-k dielectric, forming a recessed feature in the low-k dielectric, and forming a hydrocarbon layer within the recessed feature, wherein forming the hydrocarbon layer comprises chemically reacting a hydrocarbon precursor having a carbon-carbon double bond. The method further includes forming a conductor in the recessed feature, wherein the conductor overfills the recessed feature. In preferred embodiments, the hydrocarbon precursor comprises alpha-terpinene (ATRP), ethylene, $C_2H_4$, and chemicals corresponding to the general formula $(CH_3)_2CHC_6H_6$—$C_nH_{2n+1}$.

Alternative methods include a method for forming a semiconductor device having a porous, low-k dielectric. A method comprises forming a recessed feature in the porous, low-k dielectric, wherein forming the recessed feature includes using a plasma process and forming a hydrocarbon layer on the porous, low-k dielectric wherein the forming a hydrocarbon layer comprises chemically reacting a hydrocarbon precursor having a carbon-carbon double bond. Alternative embodiments further include diffusing carbon from the hydrocarbon layer to the porous, low-k dielectric.

Other embodiments provide a method for repairing a low-k dielectric damaged in a semiconductor manufacturing process. The method comprises depositing a hydrocarbon layer on the low-k dielectric by reacting a precursor material using a PECVD reaction process, wherein the hydrocarbon layer comprises between about 20 and 95 atomic percent of C, between about 5 and 80 atomic percent of H; between about 0 and 5 atomic percent of O. Alternative embodiments comprise removing a hydrocarbon blockage adjacent a narrow via and forming a diffusion barrier layer on at least the hydrocarbon layer.

Still other embodiments of the invention include a semiconductor device formed by the embodiments provided herein and further including sealing a dielectric pore damaged in a manufacturing process. In other embodiments, the semiconductor device comprises a bulk dielectric region having a bulk carbon concentration, a surface dielectric region on the bulk dielectric region, the surface dielectric region having a carbon concentration greater than or equal to about 95% the bulk carbon concentration. In still other embodiments, the low-k dielectric comprises a surface dielectric region on the bulk dielectric region, the surface dielectric region having a carbon concentration not more than about 5% less than the bulk carbon concentration.

Note that although the term layer is used throughout the specification and in the claims, the resulting features formed using the layer should not always be interpreted together as a continuous or uninterrupted feature. As will be clear from reading the specification, the semiconductor layer may be separated into distinct and isolated features (e.g., active regions), some or all of which comprise portions of the semiconductor layer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

This invention relates generally to semiconductor device manufacturing and more particularly to the formation and processing of porous, low-k dielectrics. The low-k dielectrics may include films or layers, but embodiments are not limited to these morphologies. The present invention will now be described with respect to preferred embodiments in a specific context, namely the creation of copper conductive lines and vias in the damascene process. It is believed that embodiments of this invention are particularly advantageous when used in this process. It is further believed that embodiments of this invention are advantageous when used in other semiconductor fabrication applications wherein low-k dielectric performance is a concern. It is further believed that embodiments described herein will benefit other integrated circuit interconnection applications not specifically mentioned. Therefore, the specific embodiments discussed are merely illustrative of specific ways to make and use the invention, and do not limit the scope of the invention.

Figure 1:
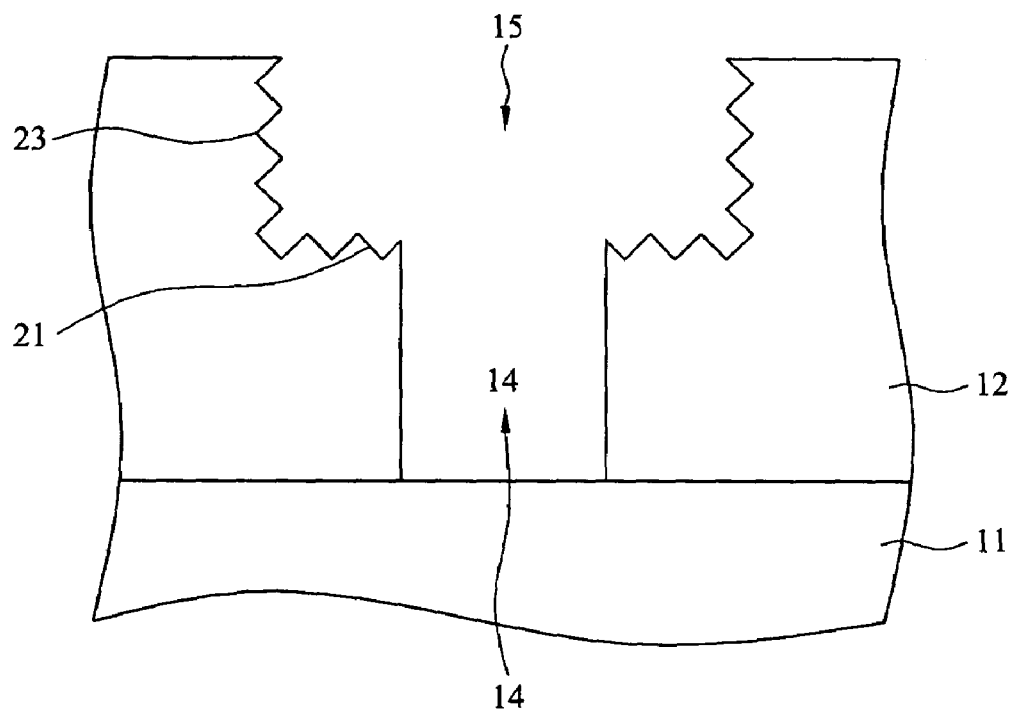
FIGS. 1 and 2 are cross sectional views of a semiconductor device at an intermediate step in a conventional damascene process illustrating low-k dielectric damage.
Figure 2:
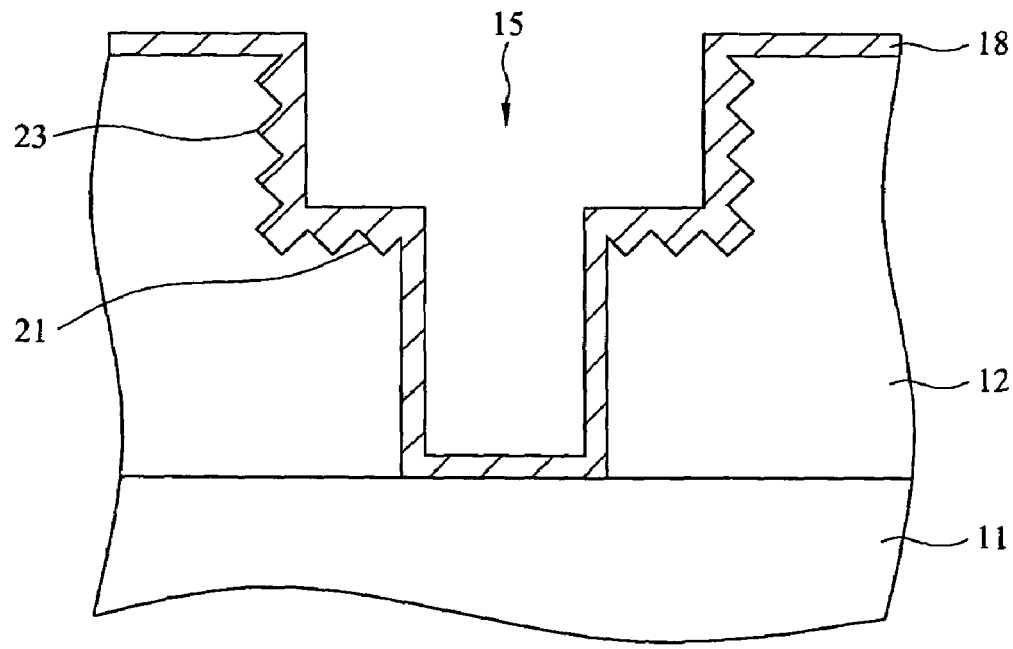
Figure 3:
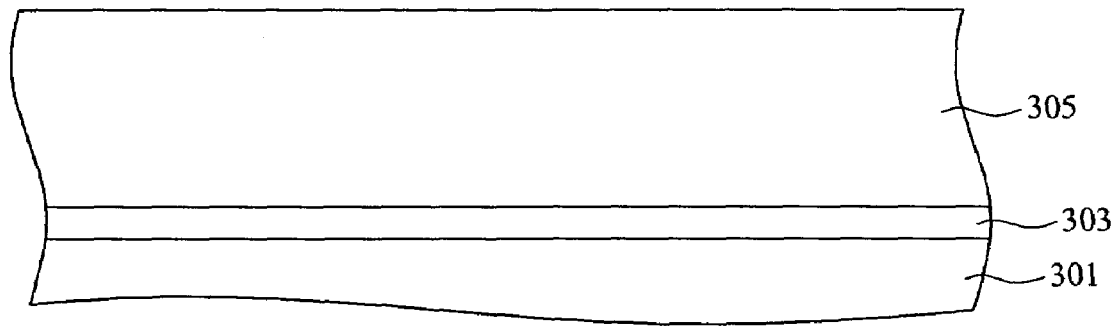
FIG. 3 is a cross sectional view of a semiconductor device containing a carbon-containing and/or porous dielectric at an intermediate step in an exemplary damascene process according to preferred embodiments.

Referring now to FIG. 3, there is shown a cross section of the representative intermediate damascene structure to be treated in accordance with an exemplary process and embodiments of the invention. Shown in FIG. 3 is a semiconductor substrate 301 that may comprise, for example, silicon, SOI, functional and logical devices, other interconnected layers, or it may comprise a combination thereof. For the purpose of describing embodiments of the invention below, the substrate 301 comprises an ILD and a conductive interconnect. The details of the damascene process are described by Bao et al. in U.S. Pat. No. 6,248,665 and in Patent Application Publication 2004/0121583, both of which are hereby incorporated by reference.

Still referring to FIG. 3, over the substrate 301 is a first etch stop layer 303. Overlying the first etch stop layer 303 is a low-k dielectric 305, also referred to as an inter-metal dielectric (IMD), an interlevel dielectric (ILD), or a dielectric layer. Suitable low-k dielectrics include a carbon-doped silicon dioxide, also referred to as organo silicate glass (OSG) and C-oxide. A preferable thickness of the low-k dielectric 305 is between about 5000 to 9000 Angstroms and it is preferably planarized. Exemplary organic low-k materials include polyarylene ether, hydrogen silesquioxane (HSQ), methyl silsesquioxane (MSQ), polysilsequioxane, polyimide, benzocyclbbutene, and amorphous polytetrafluoroethylene (PTFE, which is frequently referred to as Teflon®). Other types of low-k materials suitably used with the method of the present invention include fluorinated silicate glass (FSG) such as fluorine-doped —(O—Si($CH_3$)$_2$—O)—.

The low-k dielectric 305 may also include a class of low-k dielectrics frequently called extreme low-k (ELK) dielectrics. ELK dielectrics typically have a dielectric constant less than about 2, and they include porous dielectrics. Suitable ELK dielectric materials may include SiN, SiO, spun-on-glass (SOG), plasma enhanced (PE) tetraethoxysilane (TEOS), halogenated SiO, and fluorinated silicate glass.

Other, more preferred, ELK dielectrics include a class of dielectrics that contain an unreacted, pore-generating material, or porogen. Heating the porogen above its decomposition temperature generates pores in the dielectric. By way of example, Dow Chemical's porous SILK product and JSR Corporation's JSR 5109 are suitable, commercially available low-k precursors that utilize an organic host material. In preferred embodiments, the low-k dielectric comprises Shipley's commercially available ZIRKON™ LK ILD. ZIRKON™ LK ILD is a blend of a methylsilsesquioxane (MSQ) based material with acrylic, polymer-based, nanoparticle porogen dispersed in a solvent (PGMEA). An alternative preferred ELK includes PECVD $Si_wO_xC_yH_z$ because it has the potential to achieve k<2 either with or without a porogen.

ZIRKON™ LK ILD is preferably deposited using a conventional spin coater. After deposition, it is partially cured, preferably in a vertical furnace between about 250 and 300° C. in order to cross-link the matrix. Degradation of the ZIRKON™ LK ILD porogen begins at about 275° C., and complete degradation occurs at about 450° C.

Figure 4:
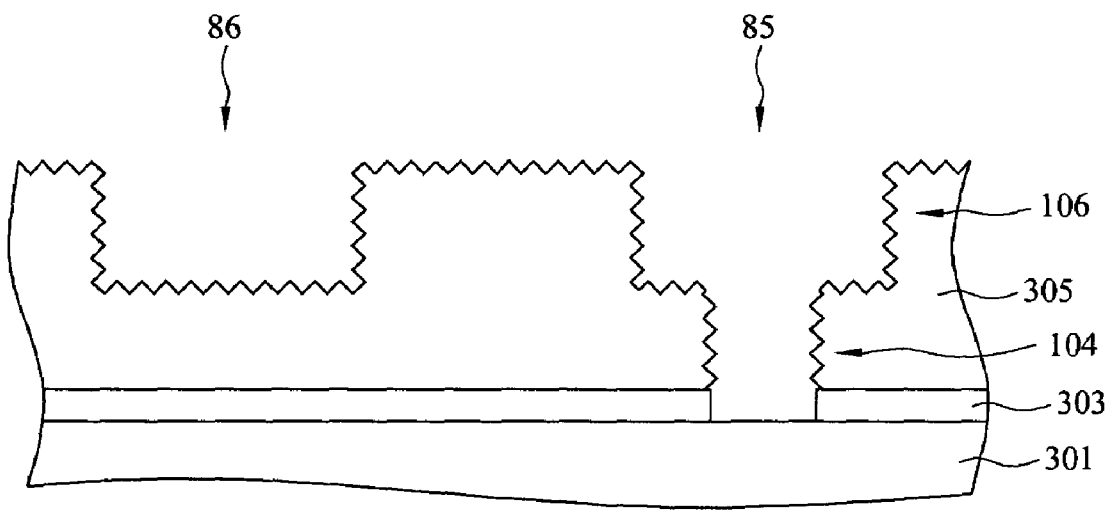
FIG. 4 is a cross sectional view of a preferred embodiment further illustrating plasma and/or etching processing damage.

Referring now to FIG. 4, there is shown a cross sectional, side view of the intermediate semiconductor device of FIG. 3 further including an anisotropically etched, intermediate, dual damascene structure 85. Within the intermediate damascene structure 85 is a recessed feature having a via 104 and a trench 106.

The dual damascene structure 85 is formed by first sequentially photolithographically patterning and anisotropically etching the via 104, through the low-k dielectric 305, and at least partially through the first etch stop layer 303. This is followed by a similar process to photolithographically pattern and anisotropically etch the trench 106 through the first etch stop layer 303 and a portion of the low-k dielectric 305. These steps form the trench 106 that overlies and encompasses the via 104. It will be appreciated that the trench 106 may encompass one or more vias and that the trench and via may be formed in separate stacked dielectrics including another etch stop layer formed between the respective dielectrics. The surface of the low-k dielectric 305 may include other recessed features such as a trench 86 to contain additional interlevel conductors.

The plasma etches used in damascene manufacturing methods are known to damage low-k dielectrics. In FIG. 4, damage to the low-k dielectric 305 is indicated by its rough surface. Note that the damage extends to the sidewalls of the trenches 86 and 106 as well as the sidewall of the via 104.

As noted above damage may include surface roughness, damaged pores, opened surface pores, and carbon depletion. Typically, damage is greater in the trenches than in the vias.

Figure 5:
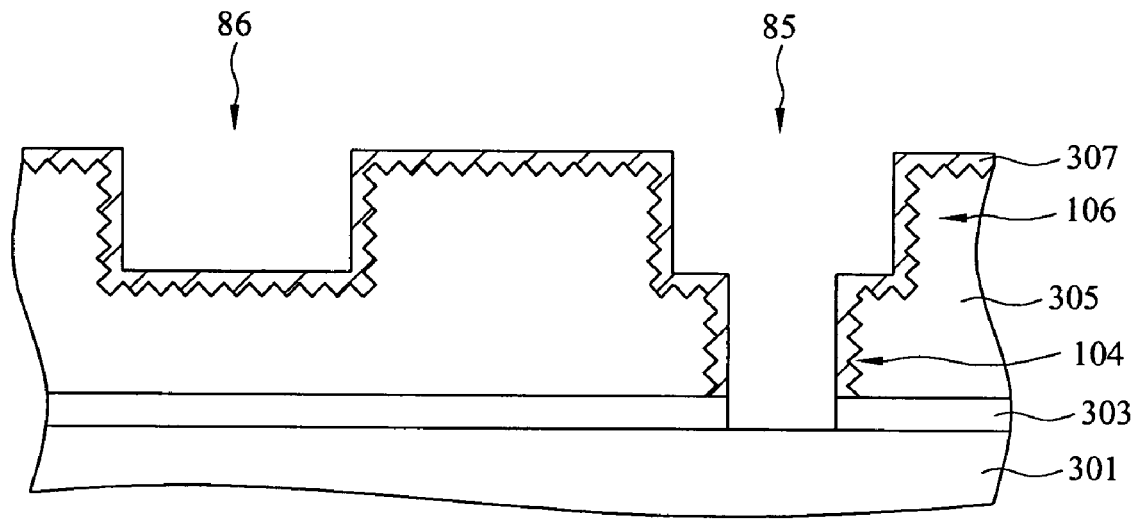
FIG. 5 is a cross sectional view of a preferred embodiment illustrating a deposition of a hydrocarbon repair layer.

Turning now to FIG. 5, and in accordance with preferred embodiments, a hydrocarbon layer 307, comprising $C_xH_y$, is deposited by chemically reacting a hydrocarbon precursor, preferably by using plasma enhanced chemical vapor deposition (PECVD). Suitable hydrocarbon precursors include chemicals having sufficient volatility so that they form a vapor in the reaction vessel. A preferred precursor is a substituted hexane derivative α-terpinene (ARTP), which has the formula $(CH_3)_2CHC_6H_6CH_3$, or ethylene, $C_2H_4$. Alternative precursors include α-terpinene analogs, wherein the alpha methyl group is replaced with a straight chain alkyl group, i.e. chemicals corresponding to the general formula $(CH_3)_2CHC_6H_6$—$C_nH_{2n+1}$. Alternative precursors include any other hydrocarbon, preferably those having a carbon-carbon double bond. Typically, the hydrocarbon layer 307 is about 40 to 50 Å when the trench depth is about 2000 Å.

The PECVD process preferably includes an inert carrier gas, such as He. The amount of He may be from about 25 sccm to about 10,000 sccm, and preferably from about 50 sccm to about 5000 sccm. The substrate temperature is between about 25° C. and about 400° C., and preferably between about 125° C. and about 350° C. A RF power density between about 50 W and about 2500 W, and preferably between about 50 W and about 1500 W is utilized. Reactor pressure during the deposition process between about 100 mTorr and about 10000 mTorr, and preferably between about 500 mTorr and about 8000 mTorr is utilized.

In accordance the present invention, the hydrocarbon layer 307 comprises between about 20 and about 95 atomic percent of C; between about 0 and about 5 atomic percent of O; and between about 5 and about 80 atomic percent of H. The main process variables controlled during a deposition process for a film are the RF power, the flow rates of the precursors, the reactor pressure and the substrate temperature.

In certain situations, the opening of a narrow, recessed feature, such as the via 104, is partially blocked by a buildup of the hydrocarbon layer 307. Unless the blockage is removed, it will hamper conductor deposition within via 104 thereby degrading device properties such as RC delay. Accordingly, embodiments of the invention may further include a pre-metal cleaning step to open via 104. The pre-metal cleaning step includes an Ar/$H_2$, or He plasma cleaning for less than about 1 minute at about 25 to 350° C.

In an alternative embodiment the hydrocarbon layer 307 is deposited using atomic layer deposition (ALD). ALD is preferred when depositing the hydrocarbon layer 307 on the sidewalls of narrow, recessed features such as vias 104. ALD layers, being highly conforming, do not block narrow openings and they achieve good penetration into narrow features.

As described above, one type of low-k dielectric damage in a conventional process is the roughening of the low-k surface dielectric. Applicants find that a conventionally processed dielectric has an average surface roughness at the trench 106 bottom of about 13.89 Å RMS. Following a pore-sealing repair step comprising deposition of a $C_xH_y$ layer, the RMS value of the trench roughness is reduced to 8.73 Å. Analysis also showed that the carbon depleted damage layer could have its carbon level suitably restored by $C_xH_y$ capping.

Figure 6:
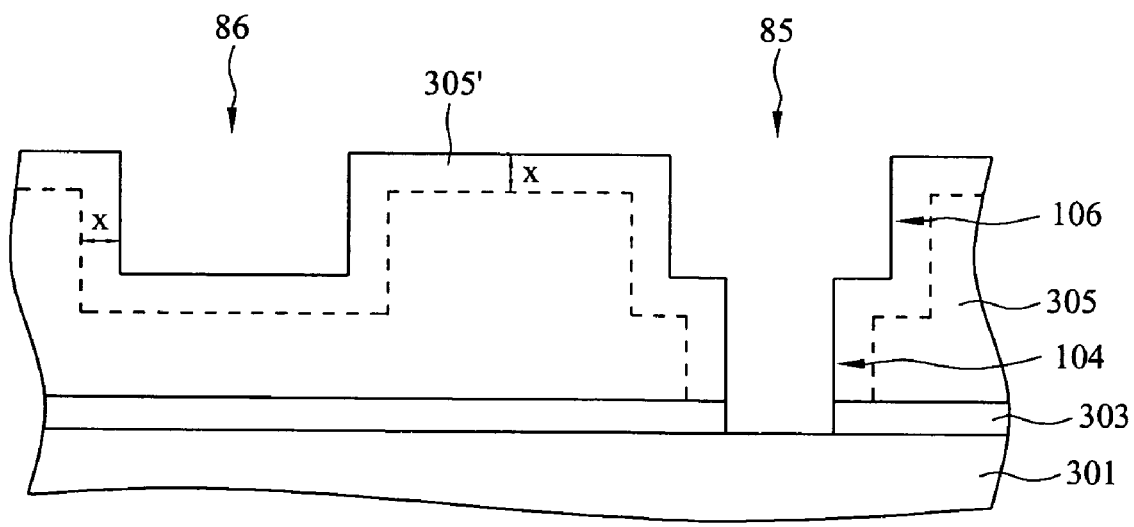
FIG. 6 is a cross sectional view of a preferred embodiment illustrating a repaired low-k dielectric.

The result of the preferred embodiment is illustrated in FIG. 6. The smooth surface of the low-k dielectric 305 indicates a repaired surface having sealed pores.

In accordance with embodiments of the present invention, carbon from the $C_xH_y$ hydrocarbon layer 307 diffuses into the low-k dielectric 305, thereby forming a carbon enriched region 305' on the surface of the low-k dielectric 305. The carbon distribution within the low-k dielectric 305 is conveniently described in terms of a bulk carbon level within a bulk dielectric region and an enriched carbon level within a surface dielectric region. The carbon enriched region 305' of the low-k dielectric 305 is schematically illustrated in FIG. 6 by the dashed line through the low-k dielectric 305 at a distance x from its surface. When hydrocarbon layer 307 is deposited according to embodiments described herein, x is typically about 300 to 500 Å thick.

In conventional processing of carbon-containing low-k dielectrics, the carbon is usually depleted from low-k surfaces. Usually the depletion is significant. Typically, the carbon level adjacent the surface dielectric is reduced about 5% to 10% below the bulk dielectric carbon levels. In preferred embodiments of the invention, however, the carbon concentration within the carbon enriched region 305' is reduced less than about 5% relative to the bulk dielectric carbon level. In other words, conventional processing depletes at more than about 5% of the surface carbon from the low-k dielectric, thereby lowering its surface carbon level to less than about 95% its initial value. Preferred embodiments restore the carbon level to at least about 95% its initial value.

Any $C_xH_y$ layer residue is preferably removed using a heat treatment at about 300 to 400° C. Generally, this heat treatment is easily integrated into another process. For example, a Cu damascene process typically includes a hydrogen plasma treatment for moisture removal from extreme low k dielectrics or for $CuO_x$ removal in Cu line reduction. Such steps are normally performed at conditions sufficient to remove $C_xH_y$ layer residue. Following removal of all $C_xH_y$ layer residue, conventional processes, may used to complete the damascene structure.

Figure 7:
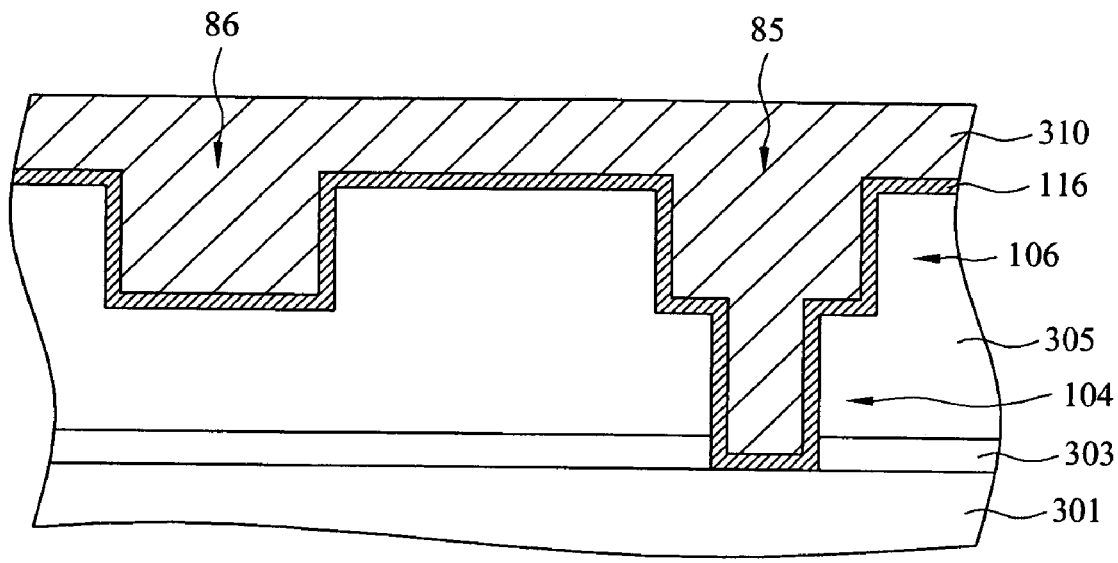
FIG. 7 is a cross sectional view of a preferred embodiment illustrating a pre-CMP planarized structure.

Turning now to FIG. 7, the barrier layer 116 is blanket deposited on the intermediate device of FIG. 6. The barrier layer 116 is preferably about 10 to 100 Angstroms thick, and it forms a barrier for Cu diffusion. The barrier layer 116 may include a metal nitride such as TaN, TiN, WN, TbN, VN, ZrN, CrN, WC, WN, WCN, NbN, AlN, and combinations thereof. In still other embodiments, the barrier layer 116 includes a Ta/TaN bi-layer structure.

The barrier layer 116 may be applied using physical vapor deposition (PVD), chemical vapor deposition (CVD), plasma enhanced chemical vapor deposition (PECVD), or plasma enhanced atomic layer deposition (PEALD). In preferred embodiments, the barrier layer 116 includes TaN, and it is deposited using atomic layer deposition (ALD).

Alternative embodiments may further include a glue layer (not shown) between the barrier layer 116 and an overlaying conductor 310. The glue layer enhances adhesion between and adjacent layers. It preferably contains materials that bond with copper and/or the underlying barrier layer 116. It may be about 10 to 500 Angstroms thick, preferably less than about 150 Å. It may include at least one layer consisting of Ru, Ta, Ti, W, Co, Ni, Al, Nb, AlCu alloy, nitrides thereof, and combinations thereof.

Prior to deposition of a conductor, a seed layer (not shown) is optionally deposited over the glue layer by, for example, PVD and/or CVD. A seed layer, preferably copper, is PVD deposited to form a continuous layer about 400 to 700 Å thick over the wafer process surface, thereby providing a continuously conductive surface for depositing the bulk of the copper during the ECD process.

Referring now to FIG. 7, following deposition of the barrier layer 116, the conductor 310, preferably copper, is electroplated according to a conventional electro-chemical deposition (ECD) process to fill trench 86 and the dual damascene trench 106 and via 104 including an overlying portion above the trench level (overfill). Although other copper filling methods such as PVD and CVD methods may be used, electroplating (electrodeposition) is preferred because of its superior gap-filling and step coverage. Alternative embodiments may include a conductor 310 consisting essentially of Cu, Al, Au, Ag, mixtures thereof, and alloyed compositions thereof.

Figure 8:
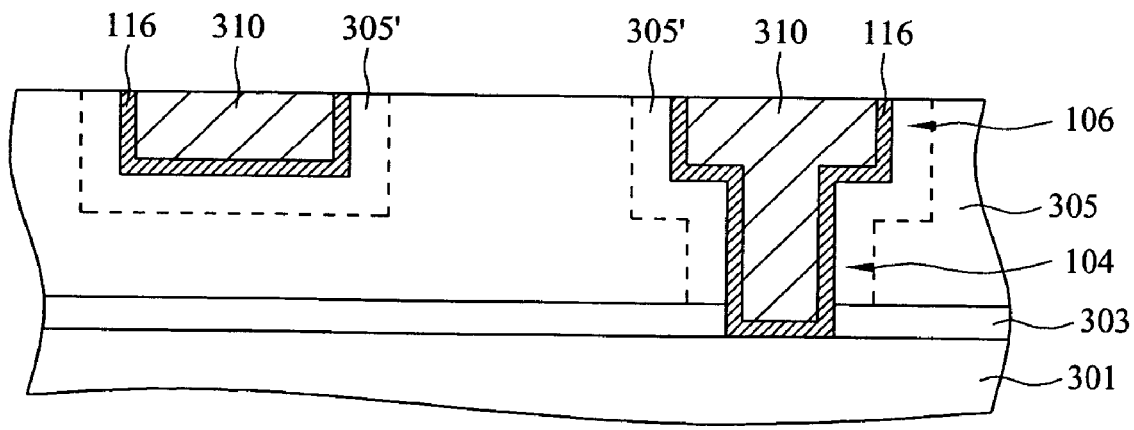
FIG. 8 is a cross sectional view of a preferred embodiment illustrating a CMP planarized structure and a carbon-enriched, low-k dielectric.

A chemical mechanical polishing (CMP) is preferably used to polish the conductor fill to the level of the feature as shown in FIG. 8. In another alternative, electropolishing or overburden reduction may be used in place of CMP or serially with CMP. In the alternative, a simultaneous CMP and plating process may be performed.

The embodiments of the invention described above are exemplary and not limiting, and variations that are apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, comprising:
   forming a low-k dielectric;
   forming a recessed feature in the low-k dielectric;
   forming a hydrocarbon layer within the recessed feature using an atomic layer deposition (ALD) process, wherein the forming the hydrocarbon layer comprises chemically reacting a hydrocarbon precursor having a carbon-carbon double bond; and
   forming a conductor in the recessed feature, wherein the conductor overfills the recessed feature.

2. The method of claim 1, wherein the low-k dielectric comprises a material selected from the group consisting essentially of organo silicate glass (OSG), borophosphosilicate glass (BPSG), borosilicate glass (BSG), phosphosilicate glass (PSG), polyarylene ether, hydrogen silesquioxane (HSQ), methyl silsesquioxane (MSQ), polysilsequioxane, polyimide, benzocyclobutene, PTFE, fluorinated silicate glass (FSG), porous oxides, porous nitrides, a porogen, and combinations thereof.

3. The method of claim 1, wherein the hydrocarbon precursor comprises a material selected from the group consisting essentially of alpha-terpinene (ARTP), ethylene, and chemicals corresponding to the general formula (CH3)2CHC6H6-CnH2n+1.

4. The method of claim 1, wherein the hydrocarbon layer comprises:
   between about 20 and 95 atomic percent of C;
   between about 5 and 80 atomic percent of H; and
   between about 0 and 5 atomic percent of O.

5. A semiconductor device formed by the method of claim 1, wherein the low-k dielectric comprises:
   a bulk dielectric region having a bulk carbon concentration; and
   a surface dielectric region on the bulk dielectric region, the surface dielectric region having a carbon concentration not more than about 5% less than the bulk carbon concentration.

6. A method for forming a semiconductor device having a porous, low-k dielectric, the method comprising:
   forming a recessed feature in the porous, low-k dielectric, wherein forming the recessed feature includes using a plasma process;
   forming a hydrocarbon layer on the porous, low-k dielectric using an atomic layer deposition (ALD) process wherein the forming a hydrocarbon layer comprises chemically reacting a hydrocarbon precursor having a carbon-carbon double bond; and
   diffusing carbon from the hydrocarbon layer to the porous, low-k dielectric.

7. The method of claim 6, wherein the hydrocarbon precursor is a material selected from the group consisting essentially of C2H4, (CH3)2CHC6H6CH3, chemicals corresponding to the general formula (CH3)2CHC6H6-CnH2n+1, and combinations thereof.

8. The method of claim 6, wherein the low-k dielectric comprises a material selected from the group consisting essentially of organo silicate glass (OSG), borophosphosilicate glass (BPSG), borosilicate glass (BSG), phosphosilicate glass (PSG), polyarylene ether, hydrogen silsesquioxane (HSQ), methyl silsesquioxane (MSQ), polysilsequioxane, polyimide, benzocyclobutene, PTFE, fluorinated silicate glass (FSG), porous oxides, porous nitrides, a porogen, and combinations thereof.

9. A semiconductor device formed by the method of claim 6, the semiconductor device further comprising:
   a bulk dielectric region having a bulk carbon concentration; and
   a surface dielectric region on the bulk dielectric region, the surface dielectric region having a carbon concentration greater than or equal to about 95% the bulk carbon concentration.

10. A semiconductor device formed by the method of claim 6, the semiconductor device further comprising:
   a pore sealed with the hydrocarbon layer, wherein the hydrocarbon layer consists essentially of between about 20 and 95 atomic percent of C, between about 5 and 80 atomic percent of H, and between about 0 and 5 atomic percent of O;
   a bulk dielectric region having a bulk carbon concentration; and
   a surface dielectric region on the bulk dielectric region, the surface dielectric region having a carbon concentration greater than or equal to about 95% the bulk carbon concentration.

11. The method of claim 6, wherein the hydrocarbon layer comprises:
   between about 20 and 95 atomic percent of C;
   between about 5 and 80 atomic percent of H; and
   between about 0 and 5 atomic percent of O.

12. The method of claim 11, wherein the hydrocarbon layer consists essentially of:
   between about 20 and 95 atomic percent of C;
   between about 5 and 80 atomic percent of H; and
   between about 0 and 5 atomic percent of O.

13. A method for repairing a low-k dielectric damaged in a semiconductor manufacturing process, the method comprising:
   depositing a hydrocarbon layer on the low-k dielectric by reacting a precursor material using a PECVD reaction process, wherein the hydrocarbon layer comprises:
   between about 20 and 95 atomic percent of C;
   between about 5 and 80 atomic percent of H;
   between about 0 and 5 atomic percent of O; and
   removing a hydrocarbon blockage adjacent a narrow via; and
   forming a diffusion barrier layer on at least the hydrocarbon layer.

14. The method of claim 13 further including a plasma etching process.

15. The method of claim 13, wherein the precursor material comprises a material selected from the group consisting essentially of C2H4, (CH3)2CHC6H6CH3, chemicals corresponding to the general formula (CH3)2CHC6H6-CnH2n+1, and combinations thereof.

16. The method of claim 13, wherein the low-k dielectric comprises a material selected from the group consisting essentially of organo silicate glass (OSG), borophosphosilicate glass (BPSG), borosilicate glass (BSG), phosphosilicate glass (PSG), polyarylene ether, hydrogen silsesquioxane (HSQ), methyl silsesquioxane (MSQ), polysilsequioxane, polyimide, benzocyclobutene, PTFE, fluorinated silicate glass (FSG), porous oxides, porous nitrides, a porogen, and combinations thereof.

* * * * *